(12) United States Patent
Goyal et al.

(10) Patent No.: US 7,250,882 B2
(45) Date of Patent: Jul. 31, 2007

(54) HIGH SPEED DATA CONVERTER TESTING DEVICES, METHODS, & SYSTEMS

(75) Inventors: Shalabh Goyal, Atlanta, GA (US); Abhijit Chatterjee, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/368,079

(22) Filed: Mar. 3, 2006

(65) Prior Publication Data
US 2006/0290548 A1    Dec. 28, 2006

Related U.S. Application Data

(60) Provisional application No. 60/693,543, filed on Jun. 25, 2005.

(51) Int. Cl.
*H03M 1/10*    (2006.01)
(52) U.S. Cl. .................. 341/120; 341/155; 341/144; 341/148
(58) Field of Classification Search ................ 341/120, 341/144, 155, 148
See application file for complete search history.

(56) References Cited

U.S. PATENT DOCUMENTS

| | | | |
|---|---|---|---|
| 5,909,186 A * | 6/1999 | Gohringer ................ 341/120 |
| 6,404,371 B2 * | 6/2002 | Takahashi et al. .......... 341/148 |
| 6,476,741 B1 | 11/2002 | Cherubal et al. | |
| 6,631,273 B1 * | 10/2003 | Eswein et al. .............. 455/462 |
| 6,964,004 B2 | 11/2005 | Chatterjee et al. | |
| 2002/0133772 A1 | 9/2002 | Voorakaranam et al. | |
| 2003/0093730 A1 | 5/2003 | Halder et al. | |
| 2004/0148549 A1 | 7/2004 | Voorakaranam et al. | |

OTHER PUBLICATIONS

McLeod, D.A.; Dynamic Testing of Analogue to Digital Converters; International Conference on Analogue to Digital and Digital to Analogue Conversion, Sep. 17-19, 1991, pp. 29-35.

Mielke, J.A.; Frequency Domain Testing of ADCs; IEEE Design & Test of Computers, vol. 13 , No. 1 , Spring 1996, pp. 64-69, 0740-7475/96.

(Continued)

*Primary Examiner*—Jean Bruner Jeanglaude
(74) *Attorney, Agent, or Firm*—Troutman Sanders LLP; Ryan A. Schneider; James Hunt Yancey, Jr.

(57) ABSTRACT

Devices and methods to test high speed analog-to-digital and digital-to-analog signal converters are provided. According to one embodiment, a testing device can comprise an output, a mixer, and an input. The output can provide a signal, and the mixer can receive the signal and provide a test signal to a data converter having a sampling frequency. The test signal can be spectrally impure. The input can sample the data converter output at a frequency less the sampling frequency so that the data converter output is under sampled. According to another embodiment, a first set of data converters are tested to obtain a mapping function that relates dynamic specifications to device signatures. Then a second set of data converters can be tested and based on their device signatures mapped with the mapping function, dynamic specifications for the second set of data converters can be obtained. Other embodiments are also claimed and described.

20 Claims, 6 Drawing Sheets

OTHER PUBLICATIONS

Yuan Tzu TIng, Li Wei Chao, Wei Chung Chao; A Practical Implementation of Dynamic Testing of an AD Converter; Proceedings of the Fifth Asian Test Symposium, Nov. 20-22, 1996, pp. 238-243; 1081-7735/96.

Yamaguchi, T., and Soma, M.; Dynamic Testing of ADCs Using Wavelet Transforms; International Test Conference, Nov. 1-6, 1997, pp. 379-388; 0-7803-4209-7/97 (Paper 16.1).

P.N. Variyam and Abhijit Chatterjee; Enhancing Test Effectiveness For Analog Circuits Using Synthesized Measurements; Proc. VLSI Test Symposium, 1998, pp. 132-137.

Dallas Semiconductor Maxim Application Note 728, Defining and Testing Dynamic Parameters in High-Speed ADCs, Part 1; Feb. 13, 2001; pp. 1-12; http://www.maxim-ic.com/appnotes.cfm/ appnote_number/728 and www.maxim-ic.com/an728.

P.N. Variyam et. al.; Prediction of Analog Performance Parameters Using Fast Transient Testing; IEEE Transactions on Computer-Aided Design of Integrated Circuits and Systems, vol. 21, No. 3, Mar. 2002; pp. 349-361; 0278-0070/02.

Srinivasan, G., Goyal, S., Chatterjee, A.; Reconfiguration for Enhanced Alternate Test (REALTest) of Analog Circuits; Proceedings of the 13th Asian Test Symposium of the IEEE Computer Society, Jan. 2004; 0-7695-2235-1/04.

Zhongjun Yu, Degang Chen, Geiger R.; Accurate Testing of ADC's Spectral Performance Using Imprecise Sinusoidal Excitations; Proceedings of the 2004 International Symposium on Circuits and Systems, vol. 1, May 23-26, 2004, pp. 645-648; 0-7803-8251-X/04.

J. H. Friedman; Multivariate Adaptive Regression Splines; The Annals of Statistics, vol. 19, No. 1, Mar. 1991, pp. 1-67.

* cited by examiner

HIGH SPEED DATA CONVERTER TESTING DEVICES, METHODS, & SYSTEMS

CROSS-REFERENCE TO RELATED APPLICATION

This application claims the benefit of U.S. Provisional Application No. 60/693,543 filed 25 Jun. 2005, which is incorporated herein by reference in its entirety as if fully set forth below.

TECHNICAL FIELD

The embodiments of the present invention are directed generally to devices, methods, and systems used to test data converters during production, and more particularly, to devices, methods, and systems to test analog-to-digital ("A/D") and digital-to-analog ("D/A") data converters using estimates of dynamic specifications during production.

BACKGROUND

Recently, there has been a vast increase in the need for speed and performance of analog and digital signal processing systems. To ensure performance, data converters employed in these signal processing systems have to meet stringent speed and accuracy requirements. While advances in semiconductor technologies have made production of such devices feasible, efficiently testing converter dynamic performance specifications continues to be a challenge.

Dynamic specifications of data converters are important in high-speed applications such as digital communications, ultrasound imaging, instrumentation, and IF digitization. Indeed, device manufacturers not only want to adequately test devices, they also desire to test devices in a timely fashion with cost-effective tools. References to converters or data converters herein should be understood to include A/D converters, D/A converters, data converters, and signal converters; these terms may be used interchangeably. To test high-speed, state-of-the-art, A/D converters for dynamic specifications high-cost, high-speed Automated Test Equipment ("ATE") is generally used.

Dynamic specification testing of A/D converters requires a Nyquist rate sinusoidal wave test stimulus having at least three bits or more accuracy than the resolution of a data converter. Fast Fourier Transform ("FFT") analysis can be performed on captured samples from a data converter using high speed testers to calculate dynamic specifications of converters such as Signal-to-Noise ratio ("SNR") and Spurious Free Dynamic Range ("SFDR"). For high speed data converters (typically having sampling frequencies of 1 Giga sample per second ("Gsps") or more), the cost of data converter testers that perform these high speed tests is high due to tester resource requirements.

Various past approaches have been proposed for testing dynamic specifications of data converters. One approach utilized a low-resolution sinusoidal wave passed through a bank of filters to generate a spectrally pure sinusoidal wave used for dynamic specification tests. The FFT of the captured response was then used to calculate the test specifications. This method, however, requires expensive ATE for testing dynamic specifications of high speed devices.

Another past approach uses sophisticated digital signal processing techniques for testing data converters. In this approach, a logic analyzer with custom designed software is used to read digital data directly from a data converter output to perform further processing. For high speed devices, however, there arises a need for synchronized low-jitter clocks running at multi-gigahertz frequencies, and this approach does not account for clock synchronization.

To determine the instantaneous value of the dynamic specifications, another approach uses wavelet transforms to compute the non-idealities. Still another approach uses a built-in-self-test approach with two imprecise sinusoidal waves having spectral dependence to determine the device dynamic performance because high purity sine waves are extremely difficult to generate on chip. For high speed data converters, however, generating such high frequency signals on-chip could result in design and reliability issues.

Most of the above mentioned approaches assume the existence of analog sources that can source analog signals at the Nyquist rate of the maximum sampling frequency for a data converter. As the sampling frequencies of the devices under testing ("DUT") increase, the costs of testers that can source such a signal increases proportionally.

Accordingly, there is a need for low cost production test approaches to test high speed data converters. It is to the provision of such high speed data converter testing devices, methods, and systems that the embodiments of present invention are directed.

BRIEF SUMMARY

The various embodiments of the present invention provide novel alternate testing based approaches to enable dynamic specification testing of high-speed, high-resolution data converters using low-cost testers. Embodiments of the present invention can be used to reduce high-speed, high-resolution data converter production and manufacturing costs. For example, some embodiments of the present invention use a low frequency, spectrally impure (imprecise) signal from a low-cost tester and under sample an output of a data converter enabling dynamic specification testing of high speed A/D converters on low cost testers.

Generally described, a data converter testing device in accordance with an embodiment of the present invention can comprise at least one mixer and an input. The testing device can also comprise an output to provide a first signal at a first frequency. The at least one mixer receives the first signal and provides a second signal at a second frequency to a data converter having a sampling frequency. The testing device input receives and samples an output of the data converter at a frequency less the sampling frequency so that the output of the data converter is under sampled. The second signal can comprise a plurality of tones or multiple frequency components such that it is not a spectrally pure signal. The mixer or a frequency combination device can combine two or more signals to provide the spectrally impure signal. Also, the sampling frequency of the data converter can be greater than the first frequency of the first signal.

The mixer can up convert the first signal at the first frequency to the second frequency so that second frequency is greater than the first frequency. The mixer can also receive a third signal and mix the first signal with the third signal to produce a mixer output or test stimulus signal with a plurality of frequency tones. The mixer can also provide an output that has a frequency component substantially equal to the bandwidth of a data converter so that dynamic specifications of the data converter can be adequately tested.

The data converter testing device can also comprise additional features. For example, the data converter testing device can comprise a clock signal provided by a clocking module. The clocking module can be coupled to the data converter testing device so that the clock signal is substantially synchronized with the first signal. The data converter testing device can also comprise a filter and a second mixer serially connected with the mixer. The filter can receive and filter the altered test signal, and provide a filtered signal to the second mixer. The second mixer can convert the filtered signal to a second altered test signal at a third frequency. The second altered test signal can comprise a plurality of tones such that it is not a spectrally pure signal.

In another embodiment of the present invention, a data converter testing method is provided. The data converter testing method can comprise providing a spectrally impure test stimulus input to a data converter device, and sampling an output of the data converter device at a frequency less than an output frequency of the data converter device such that the data converter output is under sampled to obtain a signature of the data converter device.

This method can also include estimating at least one dynamic characteristic of the data converter device by applying the signature of the data converter device to a predetermined mapping model. In addition, the method can further comprise providing a spectrally pure test stimulus to a data converter device and sampling the output of the data converter device at frequency substantially equal to the output frequency of the data converter device to obtain at least one dynamic characteristic of the data converter device. Still yet, the method can comprise generating the predetermined mapping model by mapping the signature of the data converter device to the at least one obtained dynamic characteristic of the data converter device.

A data converter testing method according to embodiments of the present invention can further include additional features. For example, a testing method can comprise mixing a plurality of signals together to provide the spectrally impure test stimulus. A testing method can further include synchronizing a data converter device with a test stimulus. The sampling frequency of the data converter can be greater than the frequency of a signal provided by the output of the data converter testing device. To appropriately test a data converter, one or more mixers can be used to up convert the frequency of a signal provided the testing device to ensure that a test signal provided to a data converter has a frequency component close to or higher than the bandwidth of the data converter. Further, providing a spectrally impure test stimulus input to a data converter device can comprise using one or more mixers to mix at least two signals to provide the spectrally impure test stimulus.

In yet another embodiment of the present invention, a system for testing dynamic specifications associated with data converters is provided. The system can comprise a first signal generator, a first processor, a second signal generator, and a second processor. The first signal generator can provide a spectrally pure test signal to a first data converter. The first data converter can provide a first output in response to the spectrally pure test signal.

The first processor can receive the first output. The first processor is preferably adapted to provide a plurality of dynamic specifications associated with the first data converter and a signature response of the first data converter in response to the test signal. The first processor can also provide a mapping function that relates the dynamic specifications to the signature response. A plurality of data converters can be utilized to produce the mapping function.

The second signal generator can provide a spectrally impure test signal to a second data converter. The second data converter can provide a second output in response to the spectrally impure test signal. The second signal generator may also comprise at least one mixer to mix signals having frequencies less than a maximum rated frequency associated with the second data converter to provide a mixer output signal that substantially equals the maximum rated frequency.

The second processor can be adapted to under sample the second output to obtain data about the second data converter. The second processor can also be adapted to apply the data to the mapping function to estimate at least one dynamic characteristic associated with the second data converter. The second processor can further be adapted to under sample the output of the second data converter at a frequency approximately half of the output frequency of the second data converter.

In still yet another embodiment of the present invention, systems and methods for generating and providing a converter test stimulus are provided. Such systems and methods can utilize a low-cost signal source to provide a high-frequency test stimulus to test dynamic specifications of one or more data converters. For example, such a system can include an output to provide a low-frequency output to a mixer. The mixer can combine the low-frequency output with another low-frequency signal to produce a mixer output having a frequency component higher than either low-frequency input. The mixer output can also have additional frequency components. The mixer output can be a test stimulus and can be provided to a data converter to test dynamic specifications of the data converter.

Other aspects and features of embodiments of the present invention will become apparent to those of ordinary skill in the art, upon review of the following description of specific, exemplary embodiments of the present invention in conjunction with the accompanying figures.

DETAILED DESCRIPTION OF PREFERRED & ALTERNATIVE EMBODIMENTS

Testing high-speed, high-resolution data converters for dynamic specifications usually requires high performance testing equipment, the cost of which can be prohibitively high. The various embodiments of the present invention provide low-cost testing devices, systems, and methods that utilize an alternate low-cost testing methodology. Embodiments of the present invention enable testing of high-performance data converters using limited testing resources. According to embodiments of the present invention, a mapping function can be generated for a first few devices and then later devices can be tested using this mapping function. Embodiments of the present invention do not require a data converter tester to have resources with higher resolution running at a speed higher than the device under test.

A typical method of measuring dynamic specifications for data converters generally includes applying a high-speed sinusoidal signal to a data converter input and obtaining the frequency spectrum of a digital output of the data converter. Usually, the high-speed sinusoidal signal is close to the maximum rated frequency of the data converter. The frequency spectrum can then be used to measure various dynamic specifications of a data converter. As the dynamic performance of a data converter degrades with increase in sampling frequency and input frequency (due to various parasitic effects), a tested data converter is clocked at a maximum sampling frequency to measure the worst case dynamic specifications of the data converter.

The input frequency (close to the maximum rated frequency) is chosen such that the coherent sampling condition in Equation 1 (shown below) is met. Satisfying this sampling condition prevents power leakage into adjacent frequency bins while constructing frequency spectrum using a finite point Fast Fourier Transform (FFT).

$$f_{IN}/f_{SAMPLE} = N_{WINDOW}/N_{RECORD}, \text{ wherein:} \qquad \text{Equation 1:}$$

$f_{IN}$: Periodic input signal;

$f_{SAMPLE}$: Sampling/clock frequency of a data converter under test;

$N_{WINDOW}$: Integer number of cycles within the sampling window; and $N_{RECORD}$: Number of data points in the sampling window or FFT.

$N_{RECORD}$ is generally taken to be a power of two to enable the use of a radix two FFT. $N_{WINDOW}$ and $N_{RECORD}$ are preferably prime. Alternatively, a suitable windowing technique can be applied to the data converter output, if incoherent sampling is performed to minimize spectral leakage.

Figure 1:
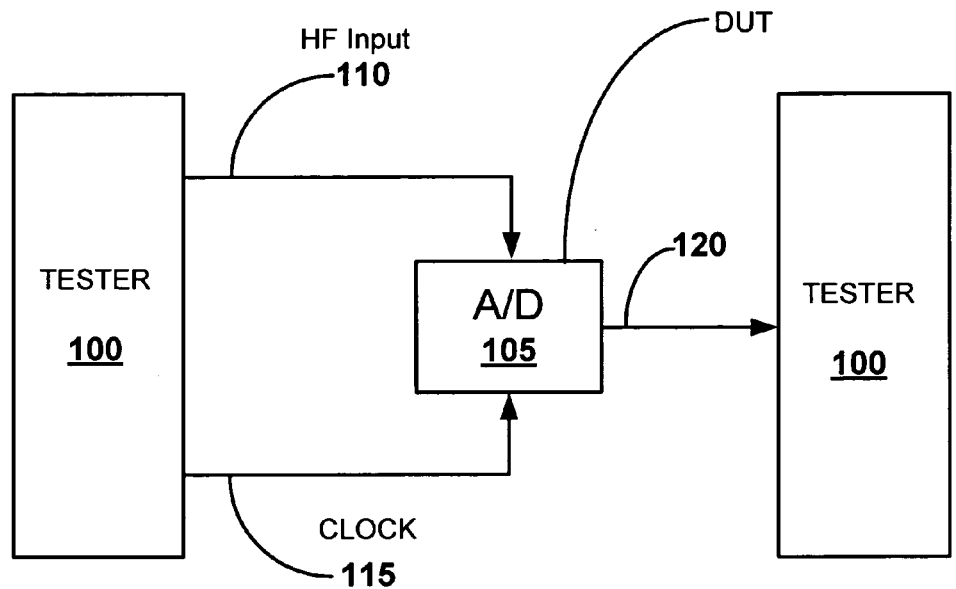
FIG. 1 illustrates a conventional testing device used to test high-speed data converters.

Referring now in detail to the figures, wherein like reference numerals represent like parts throughout the several views, FIG. 1 illustrates a conventional testing device 100 used to test high-speed data converters. As shown, this testing device 100 is testing a data converter 105 by providing a high-frequency input 110 and a clock signal 115 to the data converter 105 and receiving a data converter output signal 120. Because the data converter 105 is a high-frequency converter (e.g., having a bandwidth of 1 Gsps or more), the testing device 100 must have sufficient operating resources and must be able to operate at a higher speed than the data converter 105 to adequately test the worst case dynamic specifications of the data converter 105. Indeed, testing device 100 should be able to source a high-frequency signal input to the DUT 105 and should be capable of generating pure sinusoidal waves. As those skilled in the art will understand, conventional data converter testers, such as testing device 100, are generally cost prohibitive because they must operate faster than a DUT and have a higher resolution than the DUT to adequately test dynamic specifications of a data converter. Because of the higher resolution requirement, the testing device 100 has lower quantization noise and therefore is more expensive relative to devices having lower resolution.

Typical dynamic specifications usually measured for data converters include: Signal to Noise Ratio (SNR); Signal to Noise and Distortion Ratio (SINAD); Effective Number of Bits (ENOB); Spurious Free Dynamic Range (SFDR); Total Harmonic Distortion (THD); 2nd harmonic; and 3rd harmonic. Due to manufacturing variances, these dynamic specifications can vary from device to device. Thus, device manufacturers typically test constructed devices to ensure that certain dynamic specifications are met for quality control purposes. As discussed above, conventional data converter testing devices, such as the one shown in FIG. 1, are expensive because of the necessary components and requirement to test every constructed device with a high-cost tester. The various embodiments of the present invention provide a test approach based on an alternate test methodology and provide low cost testing devices, systems, and methods.

Alternate test methodology can be used to test analog and mixed signal devices. Rather than measuring certain dynamic specifications of a DUT directly, alternate testing applies an input signal to a DUT and then based on an output from a DUT, dynamic specifications of a DUT are estimated. Alternate testing uses a specially crafted test stimulus which is applied to a DUT and dynamic specifications are predicted from the response of a DUT. The response of a DUT is also known as a device's response signature. Alternate testing reduces test redundancy and test time because alternate testing only utilizes a single test rather than multiple tests to obtain a device's signature to estimate dynamic specifications of a DUT. Alternate testing is discussed in U.S. Patent Application Publication Numbers 2002/0133772 and 2004/0148549, which are both incorporated herein by reference.

Alternate testing is based on the concept that, due to process variations, dynamic specifications of a DUT vary in a correlated manner with measurements made on the DUT in response to an appropriate input test stimulus. Because a correlation exists between dynamic specifications and observed measurements, a mapping function can be created from the measurement space to the specification space. Indeed, a mapping function for each dynamic specification under consideration can be obtained to correlate observed measurements to dynamic specifications. Once a mapping function is known, DUT dynamic specifications can be estimated from measurements using the mapping functions on the application of a single test stimulus. Generation of a specially crafted test stimulus to provide maximum correlation between device specifications and measurements is discussed in more detail below according to embodiments of the present invention.

Figure 2:
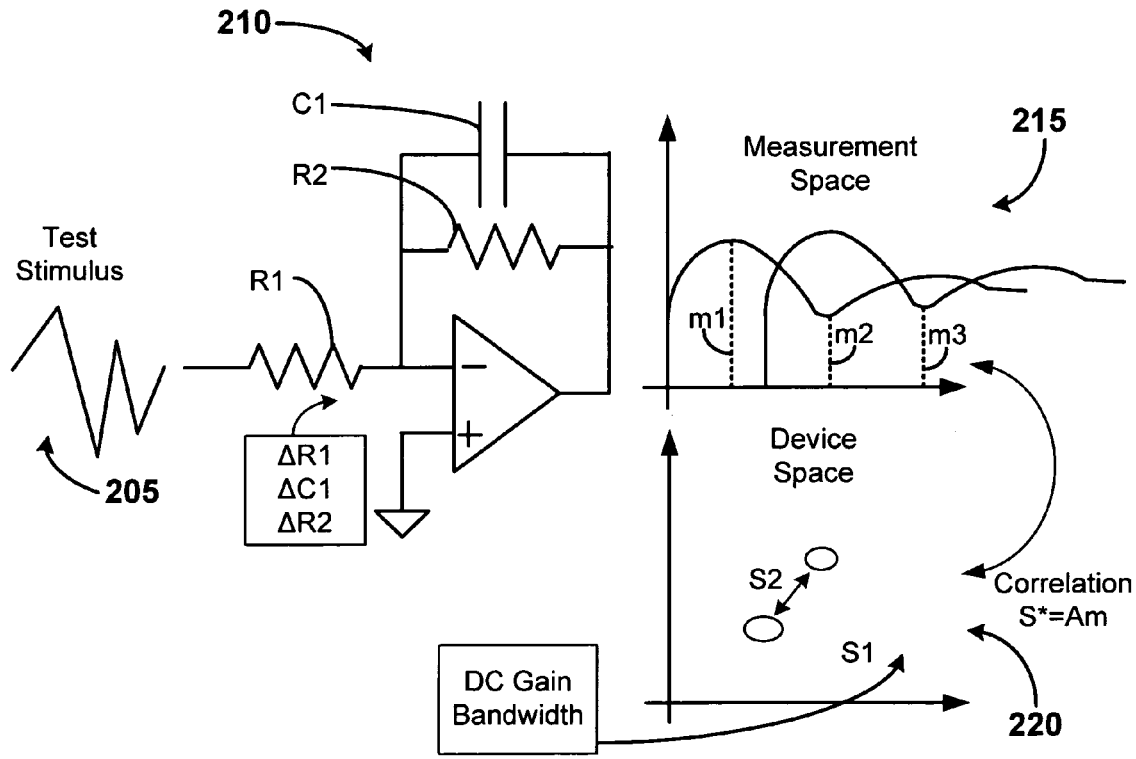
FIG. 2 illustrates a diagram depicting alternate method testing where data from a measurement space can correlate to data in a specification space.

FIG. 2 illustrates a diagram depicting alternate method testing where data from a measurement space can correlate to data in a specification space. FIG. 2 depicts a test stimulus 205 being applied to a device 210 having various RC characteristics and a measurement space graph 215 depicting several measurements observed in response to the test stimulus 205. Manufacturing variations affect both measurements and specifications. If a measure of the manufacturing process variations is known, specification values can be obtained directly, however, information related to process statistics is not readily available. Alternate testing estimates dynamic specifications from observed measurements by utilizing a mapping function that links observed measurements to specifications. For example, FIG. 2 also depicts a device specification graph 220, which is correlated to the measurements observed in the measurement space graph 215. Using alternate testing eliminates the standard dynamic specification tests, thereby reducing time and costs associated with such testing.

Alternate testing in accordance with embodiments of the present invention uses a specially crafted test stimulus. The test stimulus is applied to a DUT and dynamic specifications are predicted using pre-developed non-linear regression models from a response (device signature) of a DUT. To generate a non-linear regression model, a set of devices is chosen from one or more production lots. A test stimulus is applied to each of these devices and the responses of the devices are sampled and stored. Simultaneously, the dynamic specifications of these devices can be measured using a conventional specification tester, such as tester 100 in FIG. 1. The mapping from the observed measurements to dynamic specifications can then be done using Multivariate Adaptive Regression Splines ("MARS") to create a mapping function. Other modeling tools can be utilized to create a mapping function. These include artificial neural networks and many non-linear modeling or curve fitting tools.

During production testing, dynamic specifications of a device can be obtained using observed measurements from a low-cost test set-up (discussed in greater detail below) and pre-developed mapping models. Thus, multiple dynamic specifications can be obtained from a single test. Dynamic specifications can be related to the measurements using Equation 2:

$$S=\psi(p)*p, \text{ wherein:} \qquad \text{Equation 2:}$$

S represents the device specifications;

$\psi(p)$ is a nonlinear regression model (or another model); and p represents the amplitude of the sampled transient response (measurements).

A model can be developed using the same measurement equation for every dynamic specification that needs to be determined. Specification testing of subsequent devices utilizes measurement on the alternate test set-up using a low-cost tester. Dynamic specifications of the devices can then be estimated using the measurements and the corresponding predeveloped mapping models.

Figure 3:
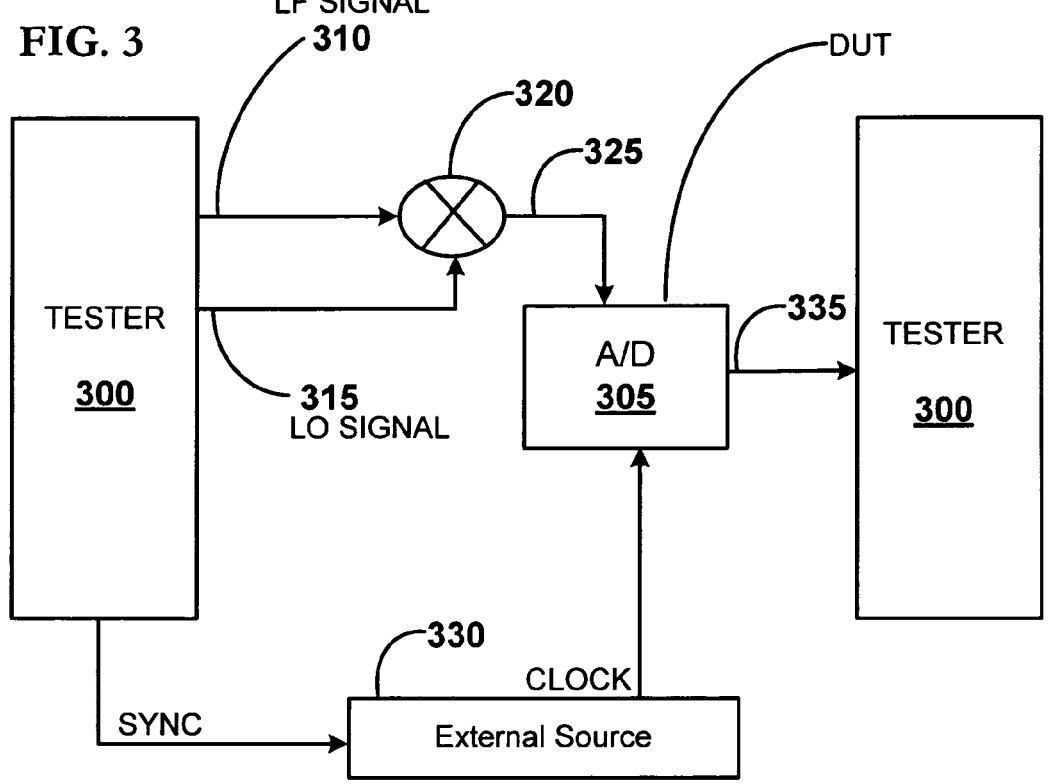
FIG. 3 illustrates a data converter testing device according to an embodiment of the present invention.

FIG. 3 illustrates a low-cost data converter testing device 300 according to an embodiment of the present invention. As shown, the testing device 300 is testing a data converter 305. The testing device 300 provides a low frequency ("LF") signal 310 and a local oscillator ("LO") signal 315 to a mixer 320. The mixer 320 can be a frequency combining device, such as a standard up-converting mixer. The inventors have used mixers manufactured by RF Micro Devices of Greensboro, N.C. and Maxim Integrated Products, Inc. (Maxim IC) of Sunnyvale, Calif. The mixer 320 combines the LF signal 310 and the LO signal 310, and provides a mixer output 325 (or test stimulus 325) to the data converter 305 as a test stimulus. The mixer output 325 preferably contains several frequency components such that it is a spectrally impure signal. One of the frequency components can be the frequency sum of the LF signal 310 and the LO signal 315. The LO signal 315 can also be generated from the testing device 300 to avoid synchronization issues, and can also have the same frequency of the LF signal 310.

Due to low jitter requirements of typical sampling clocks when testing high-speed converters, an external clocking source 330 can also be used. The external clocking source 330 can be synchronized with the testing device 300 using a SYNC line as shown. This synchronization enables the DUT 305 to be substantially synchronized with the testing device 300. A band pass filter can be used to further purify the sampling CLOCK signal and additional mixers can be used to adjust the test stimulus 325 provided to the data converter 305.

To initiate testing using testing device 300, the testing device 300 is activated and it sources a LF signal 310 and a LO signal 315 to the mixer 320. The mixer 320 up converts the LF signal 310 and then provides the mixer output 325 to the data converter 305. The mixer output 325 signal consists of both LF signal 310 and LO output 315 tones having frequencies needed to adequately test the data converter 305. Thus, a high frequency tone can be generated using a mixer and low frequency signals. The mixer output 325 is preferably determined by considering the bandwidth of the data converter 305. Indeed, to adequately test the data converter 305, the mixer output 325 preferably has a frequency component that is close to, equal to, or greater than the bandwidth of the data converter 305. For example, if the data converter 305 has a bandwidth of 500 MHz and the testing device 300 can source the LF signal 310 and LO signal 315 at 250 MHz, then the mixer 320 can combine the LF signal 310 and the LO signal 315 to provide the mixer output 325 having a frequency component of 500 MHz. The 500 MHz frequency component of the mixer output 325 can be used to test worst case dynamic specifications associated with the data converter 305.

In addition to providing an input test stimulus 325 to the data converter 305, the testing device 300 also receives an output signal 335 from the data converter 305. Preferably, the output (or output signal 335) of the data converter 305 is under-sampled. As used herein, under sampling means that the testing device 300 is sampling (or receiving) data from the output signal 335 at a lower rate than the data converter 305 is providing data in the output signal 335. In some embodiments, the data converter 305 is under sampled a lower frequency $F_{us}$ as shown in Equation 3.

$$F_{us}=F_s/n<F_{max}, n=2, 4, 8 \ldots, \text{ wherein:} \qquad \text{Equation 3:}$$

$F_s$=Data converter sampling frequency; and $F_{max}$=Maximum Tester Sampling Frequency.

As the dynamic performance of a data converter decreases with an increase in input frequency, a data converter is generally tested at a frequency that is close to the maximum bandwidth of the data converter to test the worst case dynamic specifications. Hence, it is preferable that a frequency tone close to the maximum rated input bandwidth of the data converter sampling frequency be generated to excite the worst case non-linearties in a converter being tested.

As shown in FIG. 3, an up-conversion mixer 320 is used to generate one or more high frequency input tones from a low speed tester sourcing low frequency signals. The LF signal 310 can be a sinusoidal signal provided to the mixer 320 from the testing device 300. The LO signal 315 provided to the mixer 320 is also generated from the testing device 300. The LF signal 310 and the LO signal 315 are generated from the testing device 300 and combined with mixer 320 such that one of the frequency components of the mixer output 325 is a frequency at which dynamic specifications of the DUT 305 can be measured. Mixing the LF signal 310 and the LO signal 315 can provide a mixer output 325 having a frequency component close to, substantially equal to, or greater than the bandwidth of the DUT 305, thus enabling one or more worst case dynamic specifications of the DUT 305 to be measured and tested.

Mixing the LF 310 signal and the LO signal 315 provides a spectrally impure signal containing multiple frequency components. As opposed to conventional methodology, a spectrally pure input test stimulus is not required for testing the DUT 305 using the testing device 305. Rather, a frequency tone at or substantially close to the Nyquist frequency of a DUT being tested to excite the high frequency non-linearity effects can be utilized in accordance with embodiments of the present invention. Equation 4 shows the relationship between the LO and LF input tones:

$$\omega_{IN} = \omega_{LF} + \omega_{LO}, \text{ wherein:} \qquad \text{Equation 4:}$$

$\omega_{LF}$ and $\omega_{LO}$ are the IF and LO frequency tones and Con is the frequency at which the dynamic specifications of a device being tested needs to be measured. Thus, it is possible to generate an input tone at two times the maximum frequency capability of the tester if $\omega_{LF}$ and $\omega_{LO}$ are kept equal to $\omega_{MAX}$, where $\omega_{MAX}$ is the maximum frequency output of the tester.

Figure 4:
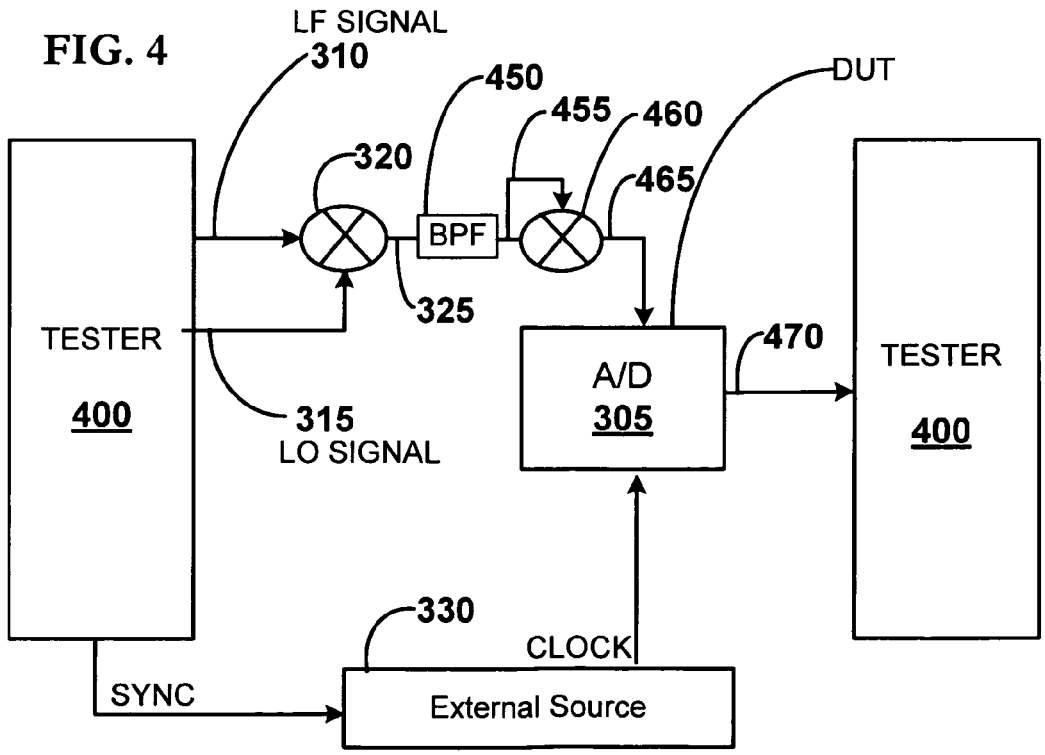
FIG. 4 illustrates a data converter testing device according to another embodiment of the present invention.

If a data converter has a bandwidth more than two times the maximum tester frequency, a series of mixers can be used to provide a high frequency test stimulus. FIG. 4 illustrates a data converter testing device 400 according to another embodiment of the present invention comprising multiple mixers. The testing device 400 has several of the same components and signals as those discussed in connection with the testing device 300 of FIG. 3. In addition, the testing device 400 has a band-pass filter 450, a band-pass filter output 455, a second mixer 460, a second mixer output 465, and a data converter output 470. The output 325 of the mixer 320 is provided to the band-pass filter 450. As shown, the mixers 320, 460 can be serially connected in some embodiments of the present invention.

The mixers 320, 460 can also be coupled to one or more band-pass filters. As shown in FIG. 4, the band-pass filter 450 provides its output signal 455 to the second mixer 460 as two inputs. The second mixer 460 up converts or combines the two output signal 455 inputs and provides the second mixer output 465 (or test stimulus). The band-pass filter 450 can be a second-order Chebyshev filter. Alternatively many other filters can also be utilized. Other filter types can include Butterworth or Elliptical filters.

The second mixer output 465 contains various frequency components and provides a test stimulus having a tone of more than twice the maximum of the testing device's 400 output frequency. That is, more than twice the frequency of the LF signal 310. According to embodiments of the present invention, additional mixers can be used so that a series of mixers can provide a test stimulus to a data converter. For example, if an input tone more than two or four times the maximum tester frequency of testing device 400 is needed, a series of mixers can be used to up-convert the LF signal 310 to provide a desired test stimulus so that the test stimulus contains frequency tones needed to adequately test a data converter.

Figure 5:
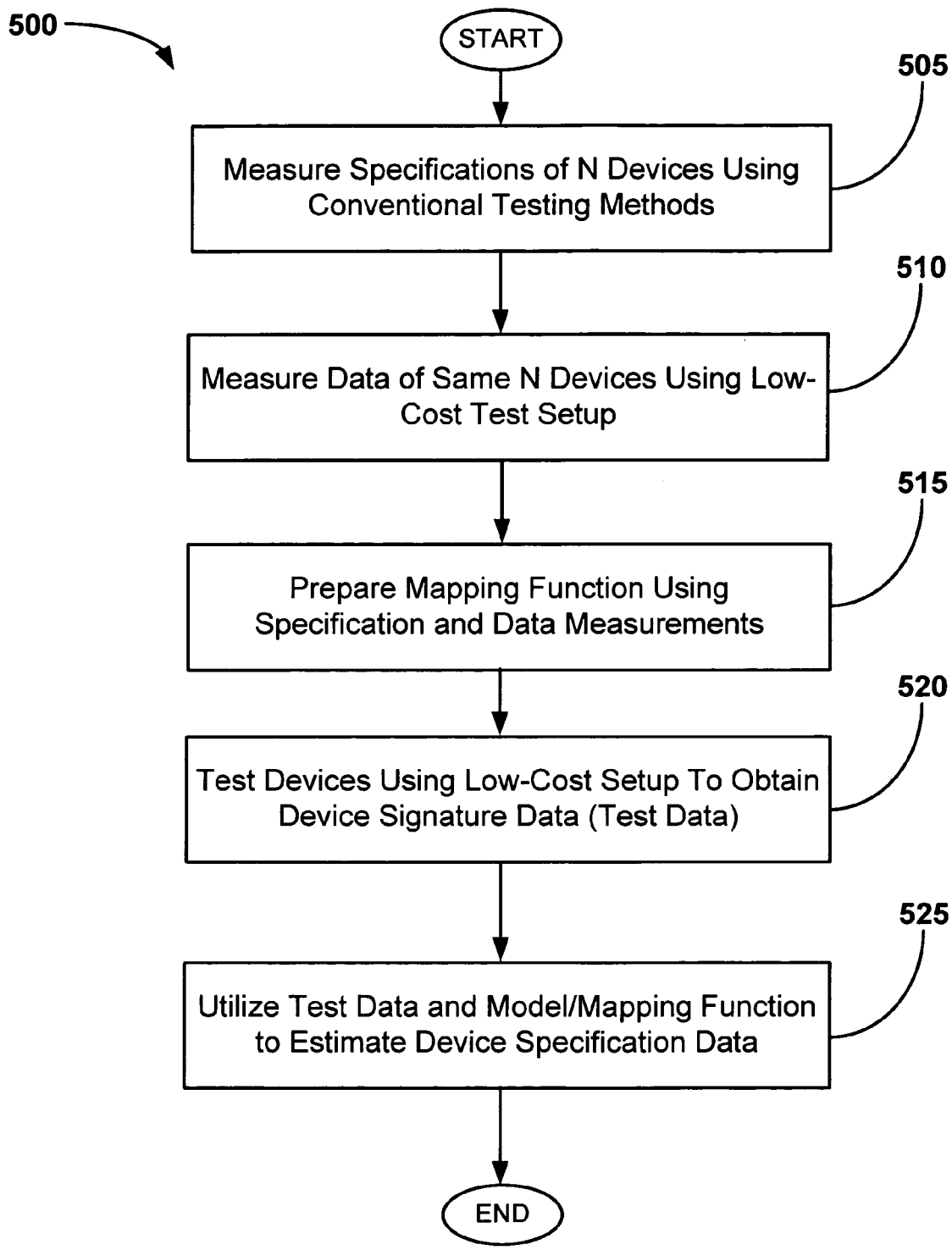
FIG. 5 illustrates a logical flow diagram of a data converter testing method according to another embodiment of the present invention.

FIG. 5 illustrates a logical flow diagram of a testing method 500 according to another embodiment of the present invention. As shown, the method 500 initiates at 505 where dynamic specifications of N devices are measured using conventional testing methods. Conventional testing methods can include using the tester of FIG. 1. Also, preferably N devices are a set of devices taken from production quantity of devices such that N is less than the number of produced devices. The inventors have discovered that N devices can be approximately five percent of a production lot, however, other percentages can also be utilized in accordance with the embodiments of the present invention. After certain dynamic specifications of the N devices are measured, the same N devices are measured using a low-cost tester at 510, such as those depicted in FIGS. 3 and 4. A low-cost tester can be utilized to obtain a response signature from a device when provided a test stimulus.

After the dynamic specifications and device signature of N devices has been obtained, a mapping function for one or more dynamic specifications can be obtained at 515. The mapping functions can be created using a predictive software modeling tool, such as MARS. Many other predictive modeling tools, such as other curve-fitting tools can be used to obtain mapping functions. In addition, it is anticipated that different modeling tools may be used depending on the actual device being tested.

Once mapping functions for the one or more dynamic specifications have been generated, converters can be tested using a low-cost test setup at 520. Examples of a low-cost test setups according to embodiments of the present invention are depicted in FIGS. 3 and 4. During testing with a low-cost test setup, a spectrally impure test stimulus can be provided to a DUT, and the spectrally impure test stimulus can have multiple frequency tone components. In addition, an output of the DUT can be under sampled to obtain a response signature of a DUT. Preferably, an up-converting mixer is used to provide the spectrally impure test stimulus according to embodiments of the present invention. Also, a testing device can source low frequency inputs to an up-converting mixer. Once a DUT has been tested using a low-cost test setup, its dynamic specifications can be estimated using a pre-developed mapping function at 525.

The inventors have also tested embodiments of their invention using software modeling techniques. The results of the software simulations are provided below and graphical test results are shown in FIGS. 6-11. The below test explanations are exemplary test explanations and should not be used to limit the breadth and scope of the present invention.

An embodiment of the present invention, similar to that shown and discussed in FIG. 3, was modeled and simulated in MATLAB. An up-converting mixer was modeled in the time domain by a third order polynomial. The conversion gain, LO leakage, noise factor, and third order intercept input point ("IIP3") of a commercially available device were used to simulate an up-converting mixer. Equation 5, below, gives the output of the mixer in time-domain:

$$O(t) = A_0 * I(t)^3 + A_1 * I(t)^2 + A_2 * I(t) + A_3 + N(t), \text{ wherein:} \qquad \text{Equation 5:}$$

$A_2 = 10^{(\text{Conversion Gain})/20}$;
$A_0 = 4*A_2/3*(\text{IIP3})^2$;
$A1 = A3 = 0$;
$I(t) = AC_{IN}(t)*LO(t) + LO_{feed}(t)$;
$AC_{IN}(t)$ is the low frequency input from the tester;
$LO(t)$ is the local oscillator sinusoidal signal;
$LO_{feed}(t)$ is the LO leakage power; and
$N(t)$ is the output noise which is calculated based on Noise Factor and input noise floor.

In addition, the following data points were used for the specifications of the modeled mixer: Conversion Gain: 4.5 dB; LO Leakage: −23 dB; IIP3: 24 dB; and NF(dB): 10.5 dB.

Figure 6:
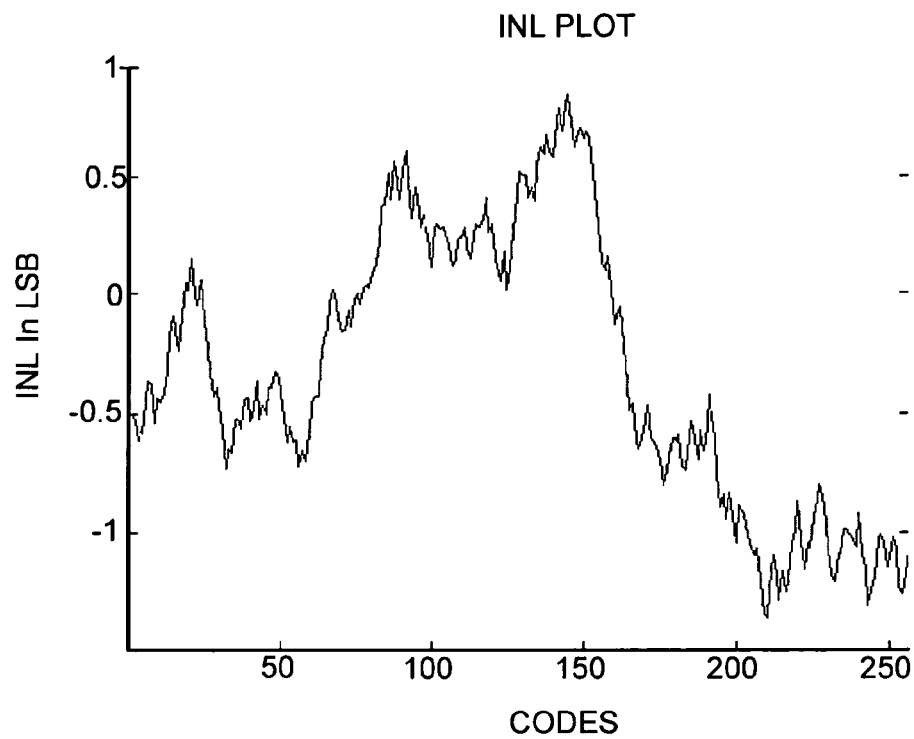
FIG. 6 illustrates a chart depicting an integral nonlinearity ("INL") plot of a simulated eight bit A/D converter.

The data converter transfer function was modeled by random differential non-linearity (DNL) characteristics. The sampling frequency of the data converter modeled was 1 Gsps and its resolution was 8 bit. Flash architecture was assumed and the code-widths were randomly varied from the ideal value of 1 LSB to insert non-ideal conditions in the device. FIG. 6 illustrates a chart depicting an INL plot of a simulated 8 bit A/D converter.

The DUT was chosen to be an 8-bit 1 Gsps A/D converter. The inventors simulated one hundred such devices. The input frequency for testing the dynamic specifications was chosen to be, close to the Nyquist frequency, at 490.11 MHz. The input frequency of the DUT was chosen to meet the coherent sampling condition, as discussed above. The output of the low cost tester was an LF tone at W1=240.11 MHz and a LO frequency tone at W2=250 MHz. Second and third harmonics from the low cost tester were assumed to be approximately −60 dBc. The IF and LO frequency sinusoidal signals were provided to the modeled mixer.

Figure 7:
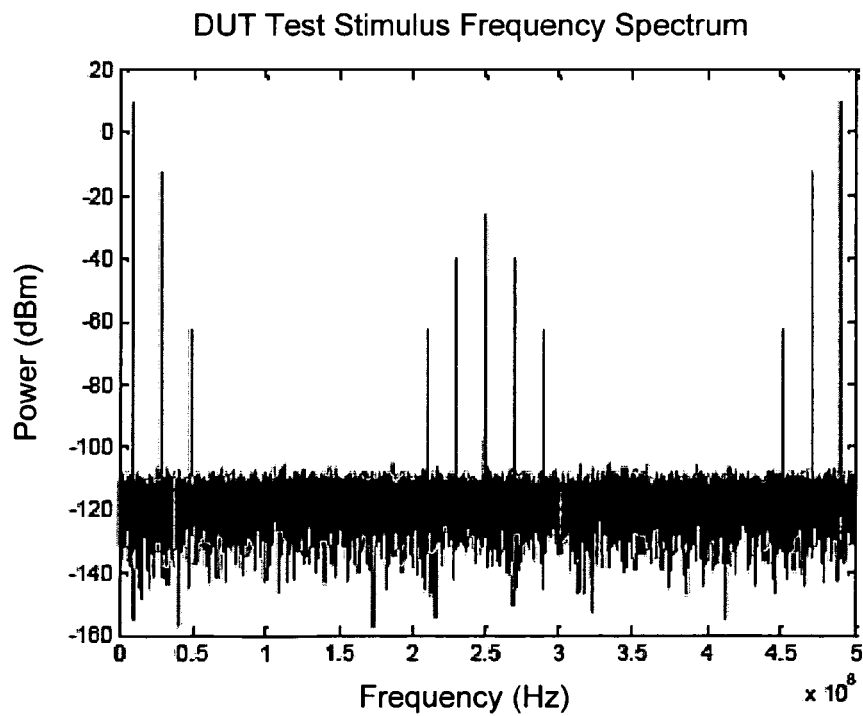
FIG. 7 illustrates a chart depicting the frequency spectrum of an input (testing stimulus) provided to a data converter device utilized by the inventors during experimentation.
Figure 8:
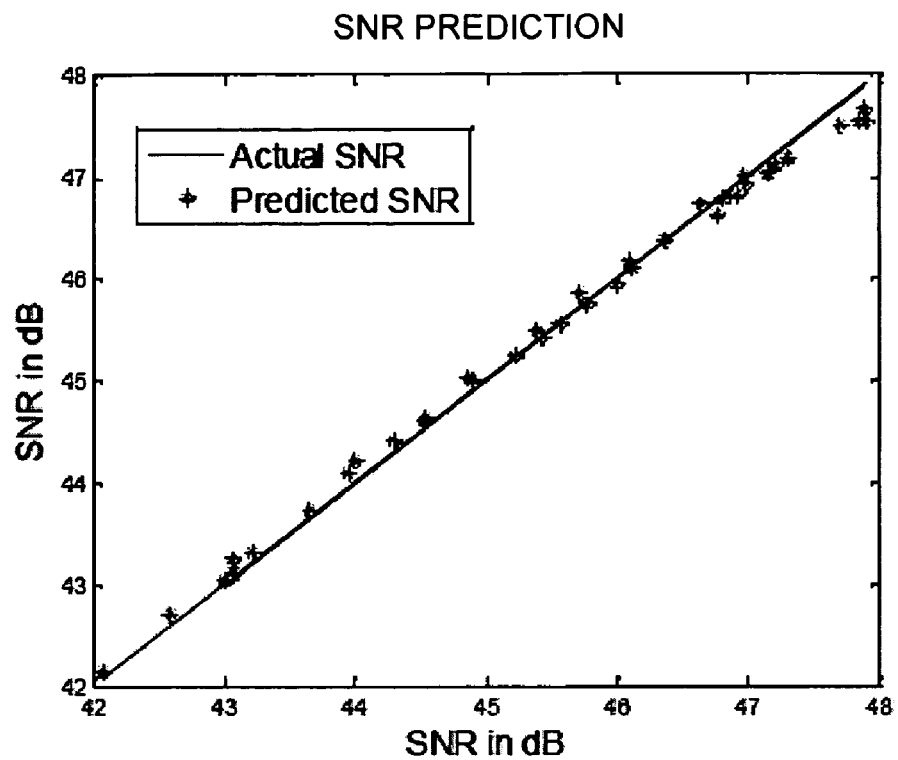
FIG. 8 illustrates a chart depicting actual SNR ratio measurements of several tested converters compared with estimated SNR ratio levels obtained using a testing device according to an embodiment of the present invention.
Figure 9:
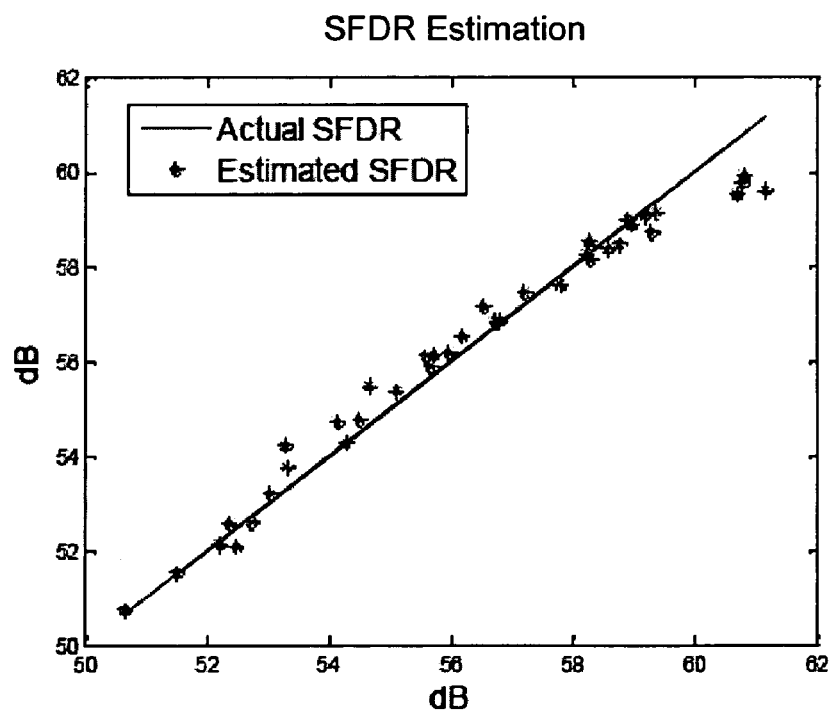
FIG. 9 illustrates a chart depicting actual SFDR measurements of several tested converters compared with estimated SFDR levels obtained using a testing device according to an embodiment of the present invention.
Figure 10:
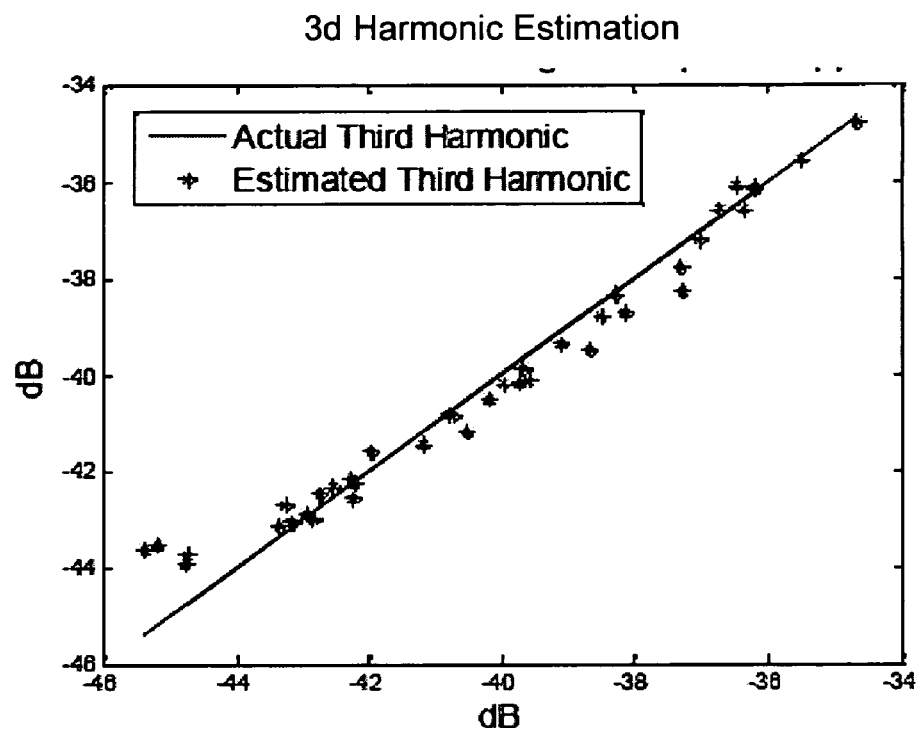
FIG. 10 illustrates a chart depicting actual third harmonic measurements of several tested converters compared with estimated third harmonic levels obtained using a testing device according to an embodiment of the present invention.
Figure 11:
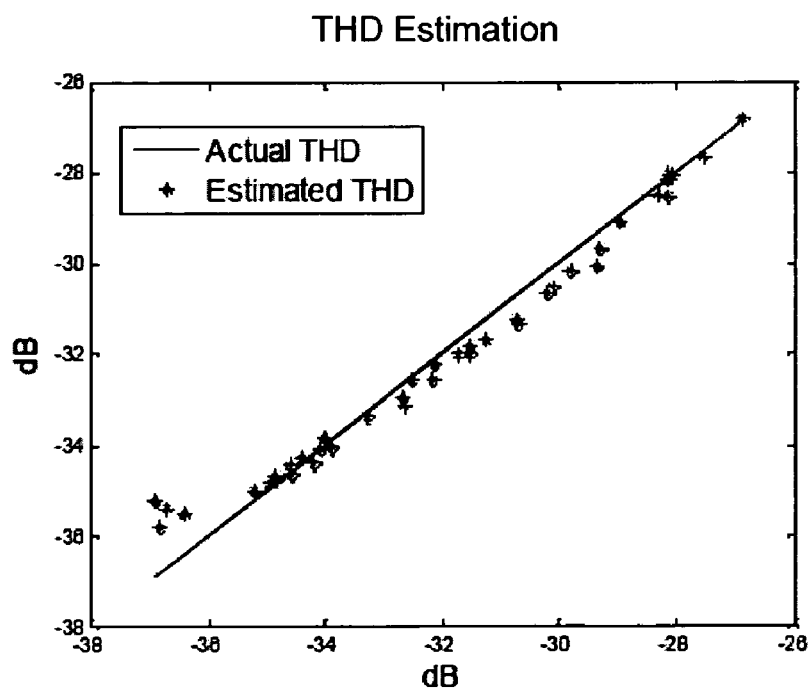
FIG. 11 illustrates a chart depicting actual total harmonic distortion of several tested converters compared with estimated third harmonic distortion levels obtained using a testing device according to an embodiment of the present invention.

FIG. 7 illustrates a chart depicting the frequency spectrum of an input (testing stimulus) provided to the A/D DUT utilized by the inventors during experimentation. The A/D converter was clocked at 1 GhZ. The sampling clock was assumed to be generated using an external clocking source synchronized with the tester using a BNC cable via 10 MHz signal from the tester. The frequency spectrum of the input signal to the A/D converter DUT shows the presence of multiple tones, as shown by the signal spikes in FIG. 7.

The output of the A/D converter was under-sampled at a sampling frequency of 250 Msps. The under-sampled output of the A/D converter was stored for model building. Conventional specification testing was performed on sixty simulated A/D converter devices. A set of models (one corresponding to each dynamic specification mapping measurements to the specifications) was then created using non-linear regression splines using MARS.

Then the remaining forty devices were tested. The signature response for each device was measured on a simulated alternate test set-up and pre-developed models were used to estimate dynamic specifications of the forty devices. The estimated dynamic specifications included: SNR, Spurious Free Dynamic Range (SFDR), Second Harmonic, Third Harmonic, and Total Harmonic Distortion (THD). ENOB was calculated directly from the SNR results.

FIGS. 8-12 show the test results obtained for the forty devices. The estimated values of the specifications are plotted with the actual specification values. The deviation from the actual specification value line signifies approximate error in prediction. Maximum and average error in estimating the dynamic specifications for the forty devices are shown in Table 1, provided below. The average error in prediction was less than approximately two percent. ENOB and SINAD can be calculated directly from SNR and THD and hence are not shown in Table 1. THD can be calculated by summing the first eight harmonics.

TABLE 1

| Dynamic Specification | Maximum Error | Average Error |
|---|---|---|
| SNR | 0.7 dBc | 0.37 dB |
| SFDR | 1.6 dB | 0.70 dB |
| Second Harmonic | 2.38 dB | 1.08 dB |
| Third Harmonic | 1.60 dB | 0.70 dB |
| THD | 1.69 dB | 0.72 dB |

Similar testing methodology was used to simulate a two mixer embodiment, similar to the embodiment of the present invention shown in FIG. 4. The results of this simulation is shown below in Table 2. Frequencies sourced from the testing device were modeled as follows: $\omega_{IF}$=145.05 MHz and $\omega_{LO}$=100 MHz. The output of the first mixer was filtered using a 2nd order band-pass filter and then self-mixed to generate a tone at 490.11 MHz.

TABLE 2

| Dynamic Specification | Maximum Error | Average Error |
|---|---|---|
| SNR | 0.43 dBc | 0.18 dB |
| SFDR | 1.70 dB | 0.46 dB |
| Second Harmonic | 3.29 dB | 0.70 dB |
| Third Harmonic | 1.70 dB | 0.46 dB |
| THD | 1.56 dB | 0.44 dB |

While the various embodiments of this invention have been described in detail with particular reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

We claim:

1. A converter testing device comprising:
    at least one mixer to receive a first signal at a first frequency and to provide a second signal at a second frequency to a converter having a sampling frequency; and
    an input to sample an output of the converter at a frequency less than the sampling frequency of the converter so that the output of the converter is under sampled.

2. The device of claim 1, wherein the second signal comprises a plurality of tones such that the second signal is not spectrally pure.

3. The device of claim 1, wherein the second signal has a frequency component that is substantially equal to the input bandwidth of the converter.

4. The device of claim 1, wherein the mixer receives a third signal having a third frequency and combines the third signal and the first signal to produce the second signal with a plurality of frequency tones.

5. The device of claim 4, wherein at least one of the frequency tones has a frequency substantially equal to the sum of the first frequency and the third frequency to test a worst cast dynamic specification of the converter.

6. The device of claim 4, further comprising a clock signal provided to the converter so that the converter is substantially synchronized with at least one of the first signal, the second signal, and the third signal.

7. The device of claim 1, further comprising: a filter and a second mixer serially connected with the mixer, wherein the filter receives the second signal and provides a filtered signal to the second mixer, and wherein the second mixer provides a spectrally impure third signal.

8. The device of claim 7, wherein the third signal has a frequency tone substantially equal to two times the first frequency to test a worst cast dynamic specification of the converter.

9. A converter testing method comprising:
    providing a spectrally impure test stimulus to a converter;
    undersampling an output of the converter to obtain a signature of the converter; and
    estimating at least one dynamic characteristic associated with the converter by applying the signature of the converter to a predetermined mapping model.

10. The method of claim 9, further comprising: providing a spectrally pure test stimulus to the converter and sampling the output of the converter at a frequency substantially equal to the output frequency of the converter to obtain at least one dynamic characteristic associated with the converter.

11. The method of claim 10, further comprising: determining the predetermined mapping model by mapping the signature of the converter to the at least one obtained dynamic characteristic associated with the converter.

12. The method of claim 9, further comprising: mixing a plurality of signals together to provide the spectrally impure test stimulus.

13. The method of claim 9, further comprising: synchronizing the converter with the spectrally impure test stimulus.

14. The method of claim 9, wherein the spectrally impure test stimulus has a frequency component approximately equal to the input bandwidth of the data converter.

15. The method of claim 9, wherein undersampling an output of the converter to obtain a signature of the converter comprises sampling the output of the converter at a frequency less than the output frequency of the converter.

16. The method of claim 9, wherein providing a spectrally impure test stimulus to a converter comprises providing a signal having a signal frequency to a mixer, wherein the spectrally impure test stimulus comprises a frequency tone substantially equal to one of twice the signal frequency and four times the signal frequency.

17. A system to test data converter dynamic specifications, the system comprising:
 a first signal generator to provide a spectrally pure test signal to a first data converter, the first data converter providing a first output in response to the spectrally pure test signal;
 a first processor to receive the first output, wherein the first processor is adapted to provide a plurality of dynamic specifications associated with the first data converter and a signature response of the first data converter, the first processor being further adapted to provide a mapping function that relates the dynamic specifications to the signature response;
 a second signal generator to provide a spectrally impure test signal to a second data converter, the second data converter providing a second output in response to the spectrally impure test signal; and
 a second processor adapted to under sample the second output to obtain data about the second data converter and apply the data to the mapping function to estimate at least one dynamic characteristic associated with the second data converter.

18. The system of claim 17, wherein the second processor under samples the output of the second data converter at a frequency less than the output frequency of the second data converter.

19. The system of claim 18, wherein the second signal generator comprises at least one mixer to mix signals to provide the spectrally impure test signal having a frequency component substantially equal to the bandwidth of the second data converter.

20. The system of claim 19, wherein a plurality of data converters are utilized to produce the mapping function.

* * * * *